(12) United States Patent
Tanzawa

(10) Patent No.: US 10,340,015 B2
(45) Date of Patent: *Jul. 2, 2019

(54) APPARATUSES AND METHODS FOR CHARGING A GLOBAL ACCESS LINE PRIOR TO ACCESSING A MEMORY

(71) Applicant: MICRON TECHNOLOGY, INC., Boise, ID (US)

(72) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/046,527

(22) Filed: Jul. 26, 2018

(65) Prior Publication Data

US 2018/0358099 A1    Dec. 13, 2018

Related U.S. Application Data

(63) Continuation of application No. 15/847,531, filed on Dec. 19, 2017, now Pat. No. 10,079,063, which is a continuation of application No. 15/452,537, filed on Mar. 7, 2017, now Pat. No. 9,892,797, which is a continuation of application No. 14/846,549, filed on Sep. 4, 2015, now Pat. No. 9,607,705.

(51) Int. Cl.
| | | |
|---|---|---|
| *G11C 7/00* | (2006.01) |
| *G11C 16/26* | (2006.01) |
| *G11C 16/08* | (2006.01) |
| *G11C 16/04* | (2006.01) |
| G11C 16/30 | (2006.01) |
| G11C 16/32 | (2006.01) |

(52) U.S. Cl.
CPC .......... *G11C 16/26* (2013.01); *G11C 16/0483* (2013.01); *G11C 16/08* (2013.01); *G11C 16/30* (2013.01); *G11C 16/32* (2013.01)

(58) Field of Classification Search
CPC ...... G11C 16/26; G11C 16/0483; G11C 16/08
USPC ........................................ 365/203, 190, 191
See application file for complete search history.

(56) References Cited

U.S. PATENT DOCUMENTS

| | | | |
|---|---|---|---|
| 7,949,818 B2 | 5/2011 | Suyama |
| 9,245,642 B1 | 1/2016 | Chen et al. |
| 9,583,160 B1 | 2/2017 | Pekny |
| 9,607,705 B1 | 3/2017 | Tanzawa |
| 9,858,971 B2 | 1/2018 | Pekny |

(Continued)

OTHER PUBLICATIONS

U.S. Appl. No. 14/846,510, entitled Apparatuses Including Multiple Read Modes and Methods for Same, filed Sep. 4, 2015.

(Continued)

*Primary Examiner* — Vu A Le
(74) *Attorney, Agent, or Firm* — Dorsey & Whitney LLP

(57) ABSTRACT

Apparatuses and methods for charging a global access line prior to accessing memory are described. An example apparatus may include a memory array of a memory. A plurality of global access lines may be associated with the memory array. The global access line may be charged to a ready-access voltage before any access command has been received by the memory. The global access line may be maintained at the ready-access voltage during memory access operations until the receipt of a post-access command. The post-access command may reset the global access line to an inactive voltage.

20 Claims, 6 Drawing Sheets

(56) References Cited

U.S. PATENT DOCUMENTS

| | | | |
|---|---|---|---|
| 9,892,797 B2* | 2/2018 | Tanzawa | G11C 16/26 |
| 10,079,063 B2* | 9/2018 | Tanzawa | G11C 16/26 |
| 2007/0091703 A1 | 4/2007 | Nishimura et al. | |
| 2008/0049505 A1 | 2/2008 | Kim et al. | |
| 2008/0175081 A1 | 7/2008 | Kim et al. | |
| 2008/0291762 A1 | 11/2008 | Kajigaya | |
| 2009/0290428 A1* | 11/2009 | Noh | G11C 5/147 365/185.22 |
| 2010/0128539 A1 | 5/2010 | Kobayashi et al. | |
| 2011/0038215 A1* | 2/2011 | Huh | G11C 7/04 365/185.22 |
| 2011/0149663 A1 | 6/2011 | Yoshida | |
| 2011/0220968 A1 | 9/2011 | Takayama et al. | |
| 2012/0127816 A1 | 5/2012 | Kajigaya et al. | |
| 2012/0213016 A1 | 8/2012 | Iida | |
| 2012/0218837 A1 | 8/2012 | Dimartino et al. | |
| 2014/0028357 A1 | 1/2014 | Mehta et al. | |
| 2014/0372678 A1 | 12/2014 | Moon et al. | |
| 2015/0325288 A1 | 11/2015 | Balluchi et al. | |
| 2016/0062656 A1 | 3/2016 | Ramaraju et al. | |
| 2017/0069362 A1 | 3/2017 | Pekny | |
| 2017/0069392 A1 | 3/2017 | Tanzawa | |
| 2017/0162241 A1 | 6/2017 | Pekny | |
| 2017/0178732 A1 | 6/2017 | Tanzawa | |
| 2018/0047434 A1 | 2/2018 | Pekny | |
| 2018/0108421 A1 | 4/2018 | Tanzawa | |

OTHER PUBLICATIONS

U.S. Appl. No. 14/846,549, entitled Apparatuses and Methods for Charging a Global Access Line Prior to Accessing a Memory, filed Sep. 4, 2015.

U.S. Appl. No. 15/794,724, entitled "Apparatuses Including Multiple Read Modes and Methods for Same", filed Oct. 26, 2017, pp. all.

U.S. Appl. No. 15/847,531 entitled "Apparatuses and Methods for Charging a Global Access Line Prior to Accessing a Memory", filed Dec. 19, 2017, pp. all.

Iwata, et al., "A High-Density NAND EEPROM with Block-Page Programming for Microcomputer Applications", IEEE Journal of Solid-State Circuits, vol. 25, No. 2, Apr. 1990, 417-424.

* cited by examiner

APPARATUSES AND METHODS FOR CHARGING A GLOBAL ACCESS LINE PRIOR TO ACCESSING A MEMORY

CROSS-REFERENCE TO RELATED APPLICATION

This application is a continuation of U.S. patent application Ser. No. 15/847,531 filed Dec. 19, 2017, issued as U.S. Pat. No. 10,079,063 on Sep. 18, 2018, which is a continuation of U.S. patent application Ser. No. 15/452,537 filed Mar. 7, 2017, issued as U.S. Pat. No. 9,892,797 on Feb. 13, 2018, which is a continuation of U.S. patent application Ser. No. 14/846,549, filed Sep. 4, 2015 and issued as U.S. Pat. No. 9,607,705 on Mar. 28, 2017. The aforementioned applications and patents are incorporated by reference herein in their entirety and for all purposes.

BACKGROUND OF THE INVENTION

Memories may be provided in a variety of apparatuses, such as computers or other devices, including but not limited to portable memory devices, solid state drives, music players, cameras, phones, wireless devices, displays, chip sets, set top boxes, gaming systems, vehicles, and appliances. There are many different types of memory including volatile memory (e.g., dynamic random access memory (DRAM)) and non-volatile memory (e.g., flash memory). Flash memory architectures may include NAND or NOR architecture.

As the physical size of non-volatile memories (e.g., NAND flash memories) decreases, capacitance related to the global wordlines can significantly increase due to an increased number of local wordlines and drivers. As a result, word line wait time becomes longer, and the read latency of the memories may increase significantly.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
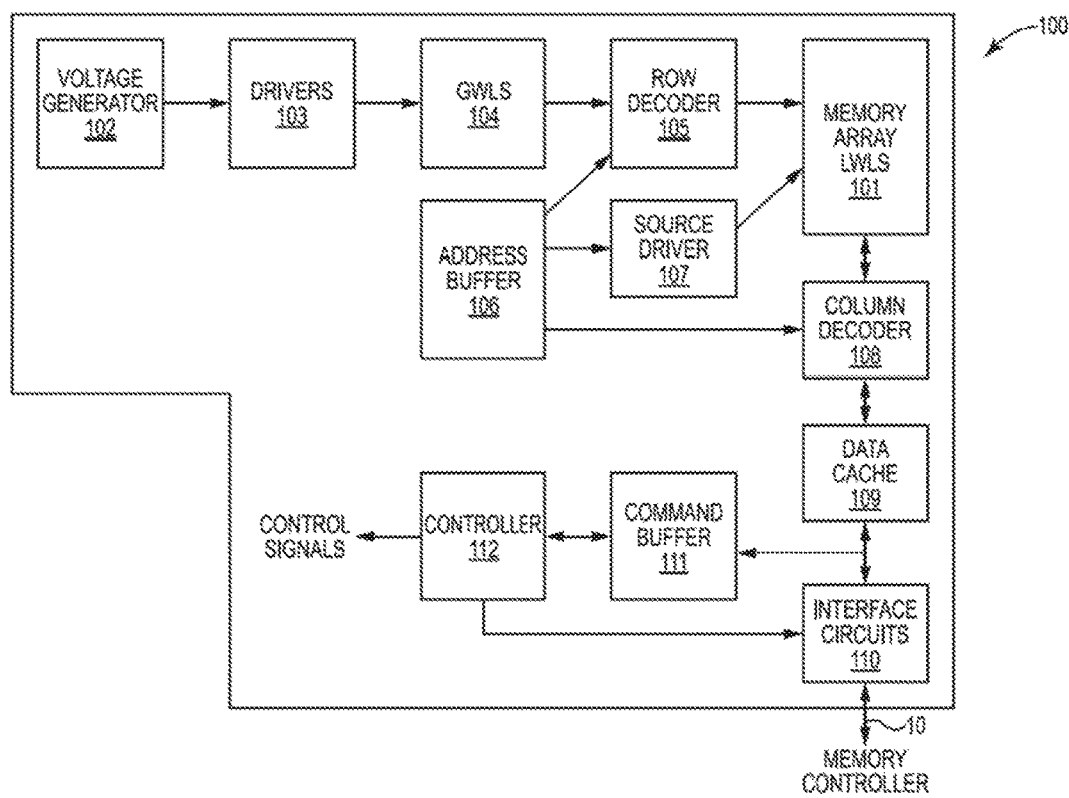
FIG. 1 is a block diagram of an apparatus including a memory according to an embodiment of the invention.

FIG. 1 illustrates an apparatus including a memory 100 according to an embodiment of the invention. As used herein, apparatus may refer to, for example, an integrated circuit, a memory device, a memory system, an electronic device or system, a smart phone, a tablet, a computer, a server, etc.

The memory 100 also includes, for example, a memory array 101, an internal voltage generator 102, drivers 103, global access (word) lines (GWLs) 104, row decoder 105, address butter 106, source driver 107, column decoder 108, data cache 109, interface circuits 110, command buffer 111, and control logic circuit 112.

In some embodiments, before any access command is issued to memory 100, internal voltage generator 102 (e.g., charge pump) may be configured to charge drivers 103 and global access lines (GWLs) 104 to a ready-access voltage, $V_{HIGH}$.

During access to memory 100, such as a read operation, in response to a control signal from control logic circuit 112, address buffer 106 will be enabled to provide an address signal to row decoder 105 and column decoder 108. Address buffer 106 is also configured to provide a signal to source driver 107. Address buffer 106 may also be configured to provide a signal to drivers 103 in order to drive a selected GWL to a voltage lower than the ready-access voltage. Row decoder 105 is configured to access a local access line (LWL) of the memory array 101 based on the address signal received from address buffer 106. Column decoder 108 is configured to access a local data line (conventionally referred to as a "bit line") based on the address signal received from address buffer 106. Source driver 107 is configured to provide a signal to a source during access of the memory array 101. The source may be, for example, a line, node, region, layer, or slot. Data cache 109 is configured to store data read from the memory array 101 or to be written to the memory array 101. The data cache 109 is coupled to die interface circuits 110, which is configured to be coupled to a bus 10 to which data is provided or received by the memory 100.

Command signals provided to the interface circuits 110 over the bus 10 are provided to command buffer 111. Command buffer 111 is configured to provide command signals to control logic circuit 112. Control logic circuit 112 is configured to provide control signals to circuits of the memory 100 to perform operations responsive to command signals provided to the interface circuit 110. For example, as will be described in more detail below, in response to a command, the control logic circuit 112 may provide control signals to circuits to enable the voltage generator 102 and to drive the GWLs to a ready-access voltage in preparation for a memory access operation. In another example, in response to another command, the control logic circuit 112 may provide control signals to the circuits to access the memory array 101, such as read stored data, and store the data in the data cache 109. In another example, in response to another command the control logic circuit 112 may provide control signals to the circuits to disable the voltage generator 102 and return the GWLs to an inactive voltage.

The control logic circuit 112 may also be configured to provide signals to the bus 10 through the interface circuits 110. The signals may be used by circuits coupled to the apparatus over the bus 10. For example, in some embodiments, the control logic circuit 112 may be configured to provide a ready/busy signal to the bus 10 that indicates when the apparatus is ready to receive commands and or completed an operation, and when the apparatus is busy and will not receive commands. The ready/busy signal may have a first logic level (e.g., high logic level) to indicate that the memory 100 is ready and may have a second logic level (e.g., low logic level) to indicate that the memory 100 is busy.

Figure 2:
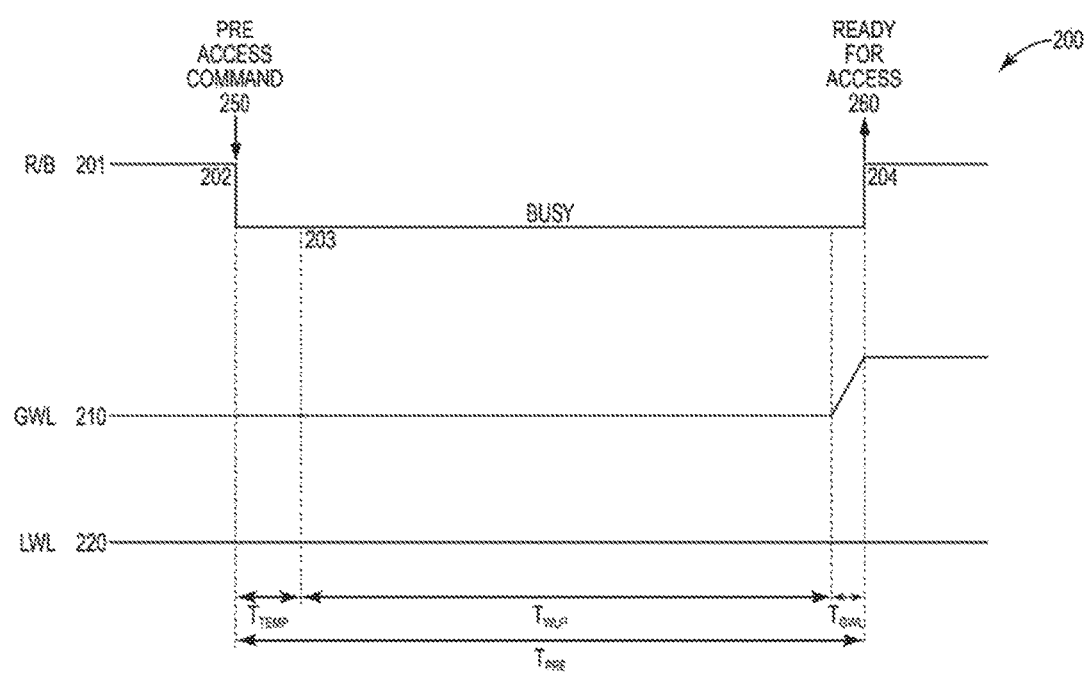
FIG. 2 is a timing diagram illustrating various signals of a pre-access command performed by the apparatus illustrated in FIG. 1, according to an embodiment of the invention.

FIG. 2 illustrates a timing diagram 200 depicting a pre-access command for a single GWL and LWL as performed by the apparatus described by FIG. 1 according to an embodiment of the invention. The pre-access command may be provided to the memory 100 in preparation for a memory access operation, such as a read operation. The pre-access command may include preparing the GWLs for a subsequent memory access operation. While FIG. 2 illustrates the timing for a single GWL, as contemplated by some embodiments of the invention, more than a single GWL, for example, all or nearly ail of the GWLs, will receive the pre-access command, before access commands are issued to memory 100.

Signal 201 represents the ready/busy state of memory 100 during the pre-access command operation. At 202, pre-access command 250 is received by the memory 100 and the control logic circuit 112 changes the logic level of the signal 201 provided by the memory 100 to indicate that the apparatus is busy. The pre-access command causes the control logic circuit 112 to provide control signals to circuits of the memory 100 to prepare the GWLs for a memory access operation. For example, the control logic circuit 112 may evaluate temperature of the memory 100 and determine various voltage values for a memory access operation. The control logic circuit 112 may provide control signals to enable the voltage generator 102 and begin driving the GWLs to a ready-access voltage. The voltage level of a GWL is represented by signal 210. The voltage level of a LWL is represented by signal 220. As depicted by signal 220, the voltage level of the LWLs remain low for the pre-access command, as no address or memory access command has been received by the apparatus during this operation.

The control logic circuit 112 evaluates apparatus temperature and determines voltage values for the pre-access operation between 202 and 203. Ideally the apparatus will operate within a temperature range between 85 and −40 degrees Celsius. In some settings, the apparatus may operate in an even wider temperature range. For example, in an automobile, the apparatus may need to operate within a temperature range between 125 and −40 degrees Celsius. It may be necessary to adjust access and data line voltages in order to mitigate the effect of these temperature conditions on the performance of the apparatus. The temperature evaluation and voltage value determination lasts for time period $T_{TEMP}$. Between 203 and 211, the control logic circuit 112 enables the voltage generator 102 to develop the GWL ready-access voltage. The GWL ready-access voltage develops over the time period $T_{WUP}$. At 211, the control logic circuit 112 controls the drivers 103 to drive the GWLs to the ready-access voltage, and the GWLs attain the read-access voltage at 212. At 204, the signal 201 changes logic levels to indicate that the apparatus is ready to receive a command. The time period from 211 to 204 lasts for time period $T_{GWL}$. The total time during which the memory 100 is busy during the pre-access operation, $T_{PRE}$, is represented between 202 and 204, which illustrate the sum of $T_{TEMP}$, $T_{WUP}$, and $T_{GWL}$.

Figure 3:
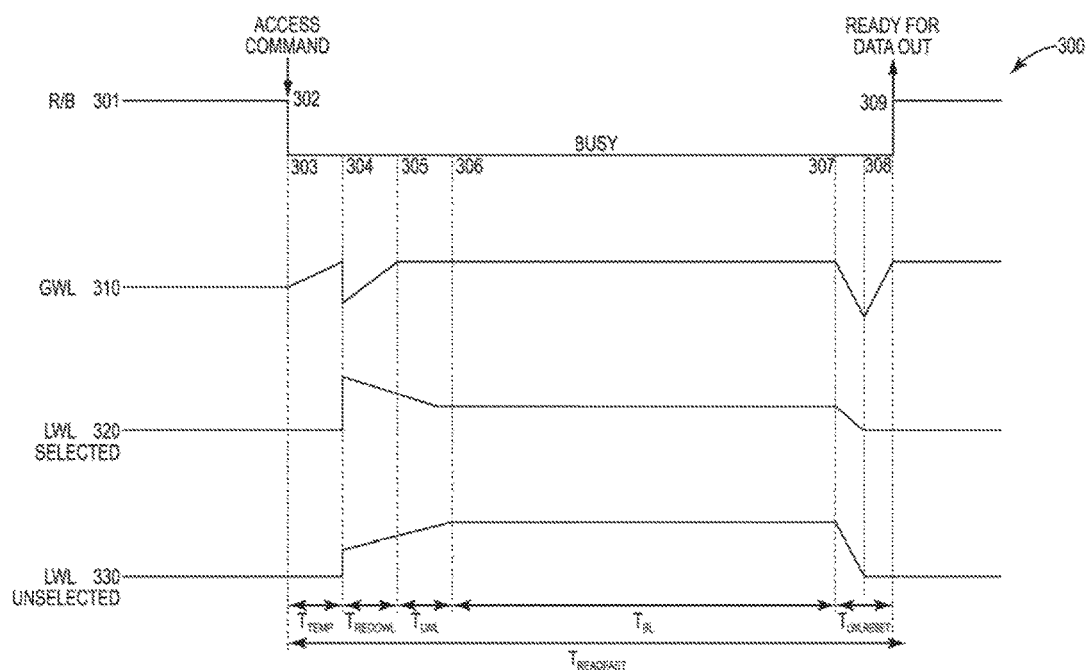
FIG. 3 is a timing diagram illustrating various signals of an access command performed by the apparatus illustrated in FIG. 1, according to an embodiment of the invention.

FIG. 3 illustrates a timing diagram 300 depicting an access command for a representative GWL and LWL as performed by the memory 100 described by FIG. 1 according to an embodiment of the invention. The access command operation may be performed for one or more of the GWLs and LWLs of the memory 100. An example access command may include a read command to read data from the memory 100.

Signal 301 represents the ready/busy state of memory 100 during the access command operation (e.g., an array read command). At 302, an access command is received by the memory 100, and the control logic circuit 112 changes the logic level of the signal 301 provided by the memory 100 to indicate that the apparatus is busy. The voltage level of a GWL is represented by signal 310. The voltage level of a selected LWL is represented by signal 320, while the voltage level of unselected LWLs is represented by signal 330.

The control logic circuit 112 evaluates apparatus temperature and determines voltage values for the access operation between 303 and 304. The time period for the temperature evaluation and voltage determination is $T_{TEMP}$. During $T_{TEMP}$, the voltage of the GWL may be adjusted based on temperature evaluation feedback. While FIG. 3 illustrates an increase in GWL voltage between 303 and 304 that corresponds to a higher relative temperature measurement of the apparatus, it is also possible that the GWL voltage will be adjusted downward based on a lower relative temperature measurement of the apparatus. At 304, the control logic circuit 112 provides controls signals to select a block in memory array 101 to be accessed corresponding to a memory address provided to the memory 100, and the GWL associated with the selected block is coupled to the LWL corresponding to the memory address. The voltage level of the GWL recovers, and the voltage levels of the selected and unselected LWLs are set to the voltage levels for the access operation between 304 and 305. The time period for the GWL, to recover from being coupled to the LWLs for the selected block is represented in FIG. 3 as $T_{REDGWL}$ between 304 and 305. The selected LWL voltage level wilt drop to a lower voltage level, while unselected LWL voltage levels reach a higher voltage level between 304 and 306. The time period from when the GWL recovers and when the voltage levels for the selected LWL and unselected LWLs level adjusts is shown in FIG. 3 as $T_{LWL}$ between 305 and 306. At 306, following the setting of the voltage levels of the access lines, data from the memory cells for the selected LWL are accessed and the stored data is read dining the time period $T_{BL}$. At 307, after the stored data has been read, a LWL reset operation begins to return the voltage levels of the selected and unselect LWLs to an inactive voltage level between 307 and 308. Following the LWL reset operation, between 308 and 309, the signal 301 changes logic levels to indicate that the apparatus is ready and the data read from memory array 101 will be ready to be provided by the memory 100. The time period from 307 to 309 for the reset operation is $T_{LWLRESET}$. During $T_{LWLRESET}$, the level of OWL 310 will return to the ready-access voltage $V_{HIGH}$. The total time from receipt of the access command to when data is ready to output is $T_{READFAST}$, as represented between 302 and 309, which is the sum of $T_{TEMP}$, $T_{REDGWL}$, $T_{LWL}$, $T_{BL}$, and $T_{LWLRESET}$. At 309, memory 100 is ready to receive another command.

Figure 4:
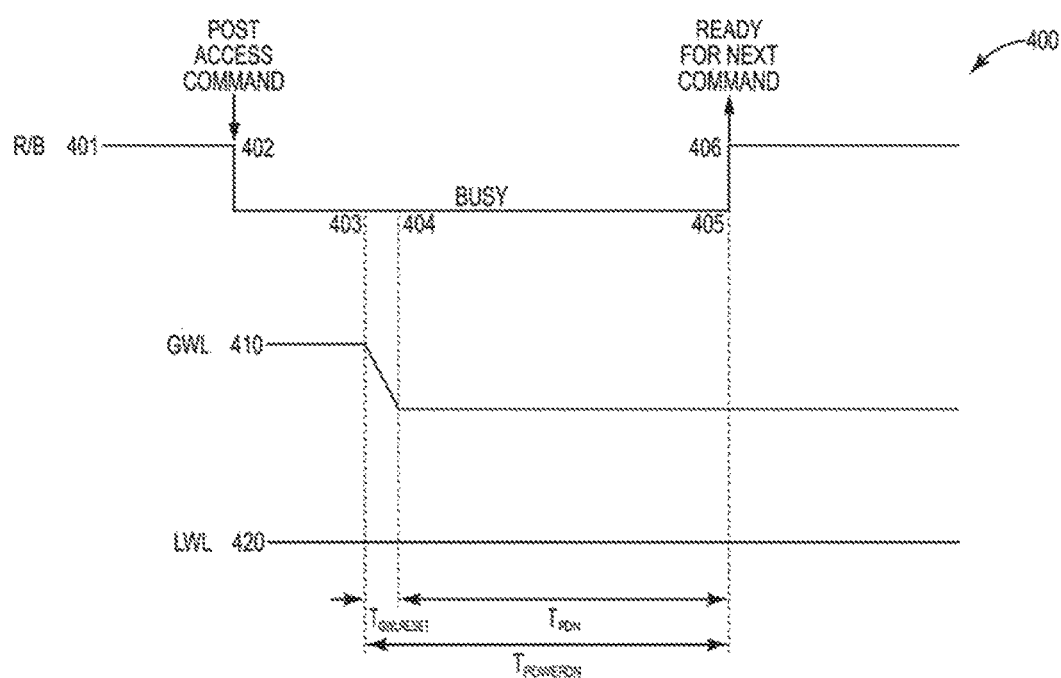
FIG. 4 is a timing diagram illustrating various signals of a post-access command performed by the apparatus illustrated in FIG. 1, according to an embodiment of the invention.

FIG. 4 illustrates a timing diagram 400 depicting a post-access command operation for a representative GWL and LWL as performed by the apparatus described by FIG. 1 according to an embodiment of the invention. The post-access command causes the control logic circuit 112 to provide control signals to enable the voltage generator 102 to reset the GWLs 104 to an inactive voltage level and power down the drivers 103 and circuits. The post-access command operation may be performed for one or more of the GWLs and LWLs of the memory 100. Signal 401 represents the read/busy state of memory 100 during the post-access operation. At 402 a post-access command is received by the memory 100, and the control logic circuit 112 changes the logic level of the signal 401 provided by the memory 100 to indicate that the apparatus is busy. Between 402 and 403, the GWLs are returned to an inactive voltage. The time between 403 and 404 is shown in FIG. 4 as $T_{GWLRESET}$. Because there is no access command during the post-access operation, LWL 420 remains low. Between 404 and 405, during time period $t_{pdn}$, internal voltage generator 102 and drivers 103 are powered down. Between 405 and 406, the control logic circuit 112 changes the logic level of the signal 401 provided by the memory 100 to indicate that the apparatus is ready to receive another command, such as the pre-access command as described respect to FIG. 2. The total time for completion of the post-access operation is $T_{POWERDN}$, as represented between 402 and 406, which illustrate the sum of $T_{GWLRESET}$ and $T_{PDN}$.

Figure 5:
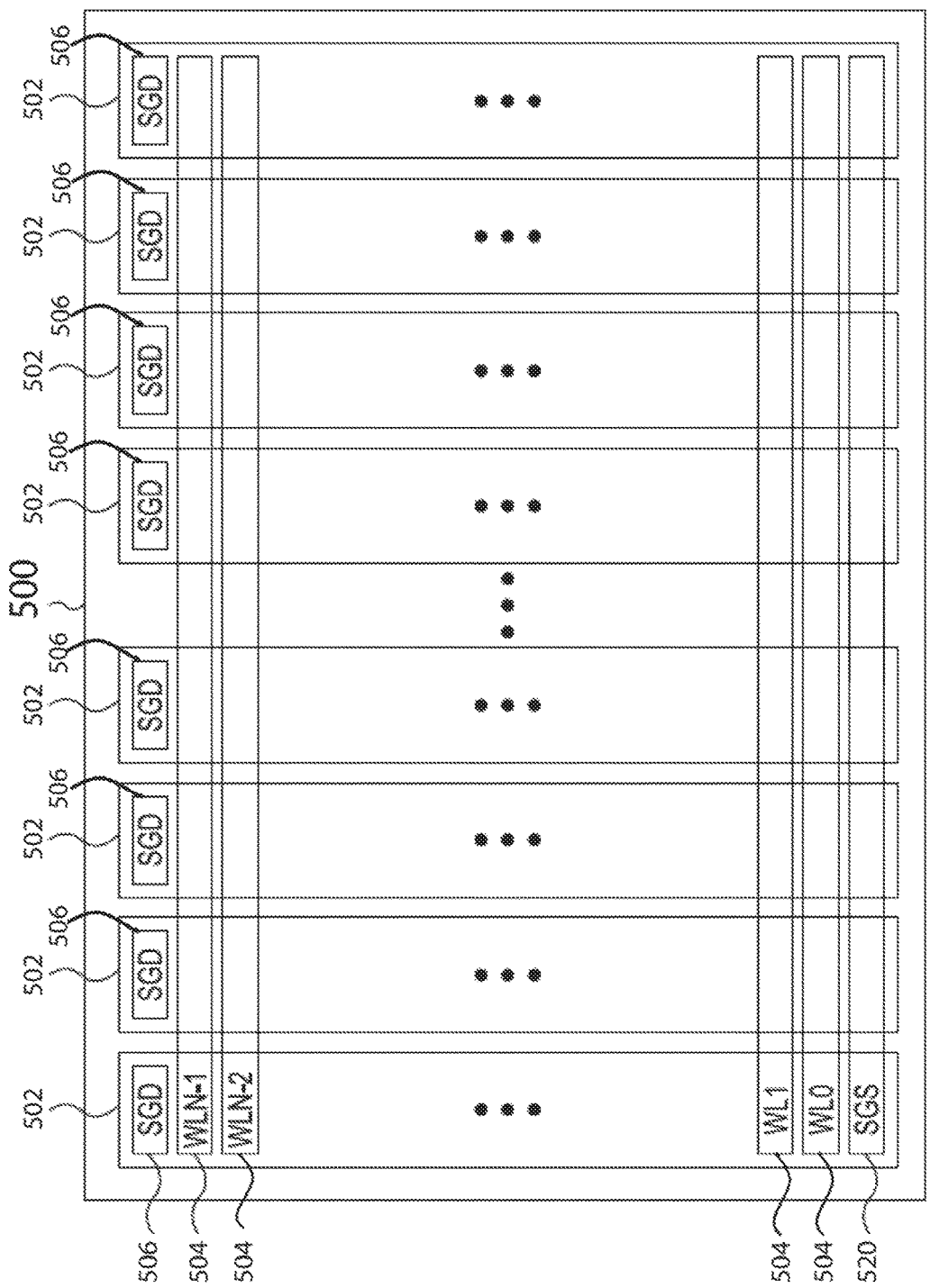
FIG. 5 is a schematic block diagram of an apparatus including a memory block according to an embodiment of the present invention.

FIG. 5 illustrates an apparatus including a memory 500 according to an embodiment of the invention. FIG. 5 is a block diagram of an apparatus that includes a memory block 500 according to an embodiment of the present invention. As used herein, apparatus may refer to, for example, an integrated circuit, a memory device, a memory system, an electronic device or system, a smart phone, a tablet, a computer, a server, etc. The memory block 500 includes a plurality of memory subblocks 502, a plurality of memory access lines (e.g., word lines) 504, a plurality of select gate drain (SGD) control lines 506, and a select gate source (SGS) control line 520. Each of the SGD control lines 506 may be associated with a respective memory subblock 502 and the SGS control line 520 may be associated with a respective plurality of memory subblocks 502.

In some examples, each of the memory subblocks 502 may include a plurality of memory cells, such as non-volatile memory cells (e.g., NAND memory cells) that may be arranged in rows and/or columns. In some examples, each of the memory cells may be a single-level cell (SIC) and/or may be a multi-level cell (MLC). In this manner, each memory cell may be programmed to distinct voltage states, each of which may correspond to a particular representation of binary data (e.g., partial bit data, single bit data 0, 1, multi-bit data 00, 01, 10, 11).

Figure 6:
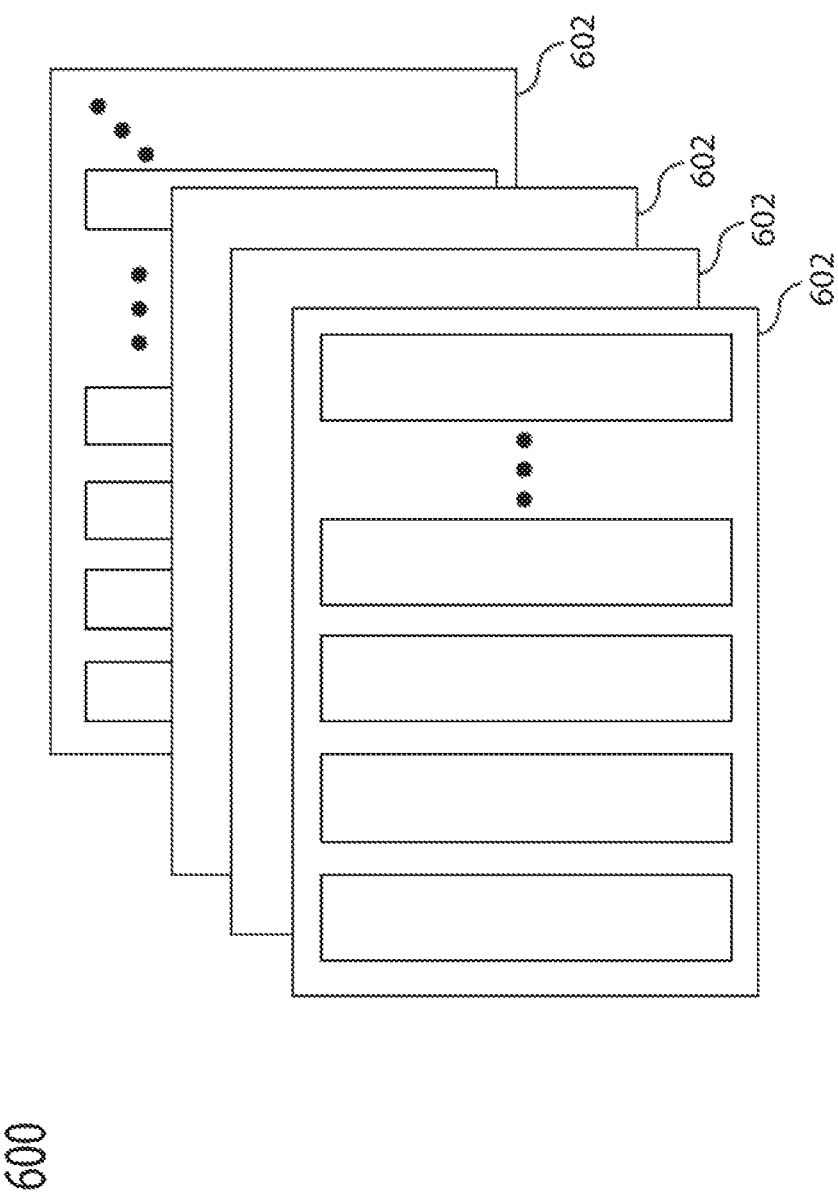
FIG. 6 is a block diagram of a vertical NAND memory array according to an embodiment of the present invention.

In some examples, the block 500 may be implemented with vertical NAND (VNAND) strings. FIG. 6 is a block diagram of a VNAND array 600 according to an embodiment of the present invention. The VNAND array 600 may include any number of blocks 602, one or more of which may be implemented using the block 500 of FIG. 5. By way of example, the VNAND array 600 may include 32 blocks 602, or may include 64 blocks 602. In some examples, memory cells of each block 602 may be accessed concurrently, simultaneously, and/or in an otherwise overlapping manner such that data may be read from, programmed to, and/or erased from multiple blocks 602 in accordance with one or more memory operations. In other examples, the blocks 602 may be configured to share one or more components, such as signal lines and/or control lines.

From the foregoing it will be appreciated that, although specific embodiments of the invention have been described herein for purposes of illustration, various modifications may be made without deviating from the spirit and scope of the invention. For example, FIG. 1 illustrates embodiments of memory 100, memory array 101, control logic circuit 112, and so forth. However, other apparatuses, memory banks, controller circuits, subarrays, and so forth may be used, which are not limited to having the same design, and may be of different designs and, include circuitry different from the circuitry in the embodiments illustrated in the figures.

Accordingly, the invention is not limited to the specific embodiments of the invention described herein.

What is claimed is:

1. An apparatus comprising:
   a memory array including signal lines; and
   a control logic circuit configured to charge at least one signal line of the memory array responsive to a pre-access command, the control logic circuit configured, responsive to the pre-access command, to control a voltage of the at least one signal line based partly on a temperature of the apparatus.

2. The apparatus of claim 1, wherein the signal lines comprise access lines and data lines.

3. The apparatus of claim 1, wherein the apparatus corresponds to a smart phone, tablet device, electronic device, memory device, memory system, or any combination thereof.

4. The apparatus of claim 1, wherein temperature of the apparatus corresponds to a temperature range between 125 and −40 degrees Celsius.

5. An apparatus comprising:
   a memory array including signal lines; and
   a control logic circuit configured to charge at least one signal line of the memory array responsive to a pre-access command, the control logic circuit configured to control a voltage of the at least one signal line based partly on a temperature of the apparatus, wherein the control logic circuit is configured to provide control signals based on temperature evaluation feedback associated with a temperature measurement of the apparatus.

6. The apparatus of claim 5, wherein the control signals comprise signals to adjust signal line voltages based on the temperature evaluation feedback.

7. The apparatus of claim 5, further comprising:
   voltage circuitry configured to charge the at least one signal line of the memory array to a ready-access voltage based on the control signals.

8. The apparatus of claim 7, wherein the control signals comprise signals to enable the voltage circuitry to develop the ready-access voltage.

9. The apparatus of claim 7, wherein the voltage generator is configured to reset the at least one signal line to a different voltage than the ready-access voltage.

10. The apparatus of claim 5, wherein the control signals comprise signals to reset the at least one signal line of the memory array to an inactive voltage responsive to a post-access command.

11. The apparatus of claim 5, wherein the control signals comprise signals to indicate that memory array is ready to receive an additional command.

12. The apparatus of claim 10, wherein the additional command corresponds to another pre-access command.

13. The apparatus of claim 1, wherein the control logic circuit is configured to provide control signals to access the memory array.

14. The apparatus of claim 1, further comprising:
   a data cache coupled to the memory array, wherein the control signals comprise signals to store read data into the data cache.

15. A method comprising:
   responsive to a pre-access command:

providing a control signal that prepares a signal line of a memory for memory access; and determining a voltage for the signal line based partly on a temperature of the memory; and accessing the memory.

16. The method of claim 15, further comprising:

evaluating temperature feedback to determine the temperature of the memory.

17. The method of claim 16, wherein the evaluating the temperature feedback occurs during a first time period.

18. The method of claim 17, wherein determining the voltage for the signal line based partly on the temperature of the memory occurs during the first time period.

19. The method of claim 17, further comprising:

during a second time period, enabling a voltage generator to develop a ready-access voltage.

20. The method of claim 19, further comprising:

during a third time period, charging the signal line of the memory to the ready-access voltage.

* * * * *